United States Patent [19]

Moore et al.

[11] Patent Number: 4,902,982

[45] Date of Patent: Feb. 20, 1990

[54] NONLINEAR NONINVERTING TRANSIMPEDANCE AMPLIFIER

[75] Inventors: Charles E. Moore; Robert A. Zimmer, both of Loveland, Colo.

[73] Assignee: Hewlett-Packard Company, Palo Alto, Calif.

[21] Appl. No.: 279,400

[22] Filed: Feb. 9, 1989

[51] Int. Cl.⁴ .................................................. H03F 1/34
[52] U.S. Cl. ...................................... 330/85; 330/308; 330/110
[58] Field of Search ............... 330/59, 85, 110, 277, 330/291, 293, 308; 307/490, 491, 501

[56] References Cited

U.S. PATENT DOCUMENTS

| | | | |
|---|---|---|---|
| 4,048,573 | 9/1977 | Evans et al. | 330/2 |
| 4,291,276 | 9/1981 | Ida | 330/85 |
| 4,540,952 | 9/1985 | Williams | 330/279 |

OTHER PUBLICATIONS

R. G. Smith, Receiver Design for Optical Fiber Communication Systems, Semiconductor Devices for Optical Communication, 1980, pp. 126-132.
Iwashita, et al., Monolithic Integrated Amplifiers for a Gigabit Optical Repeater, Electronics Letters, 24 May 1984, pp. 470-471.
Owen, et al., A Single-Chip NMOS Preamplifier for Optical Fiber Receivers, 1983 IEEE International Solid-State Circuits Conference, pp. 80-81.
Asad A. Abidi, Gigahertz Transresistance Amplifiers in Fine Line NMOS, IEEE Journal of Solid-State Circuits, vol. SC-19, No. 6, Dec. 1984, pp. 986-994.

Primary Examiner—Steven Mottola
Attorney, Agent, or Firm—Guy J. Kelley

[57] ABSTRACT

A nonlinear noninverting amplifier design for receiving and amplifying an input signal in an optical communication scheme having a nonlinear inverting feedback is disclosed. The inverting feedback varies nonlinearly with the input signal to avoid saturation of the amplifier while providing a zero state input amplitude signal to reduce the amplitude of the input signal required to turn-on the feedback, thus allowing the amplifier to operate with a wide variation of optical generators, paths, and converters. A nonlinear noninverting amplifier design is provided which eliminates the need for automatic gain control circuitry and can be designed as an integrated circuit.

35 Claims, 7 Drawing Sheets

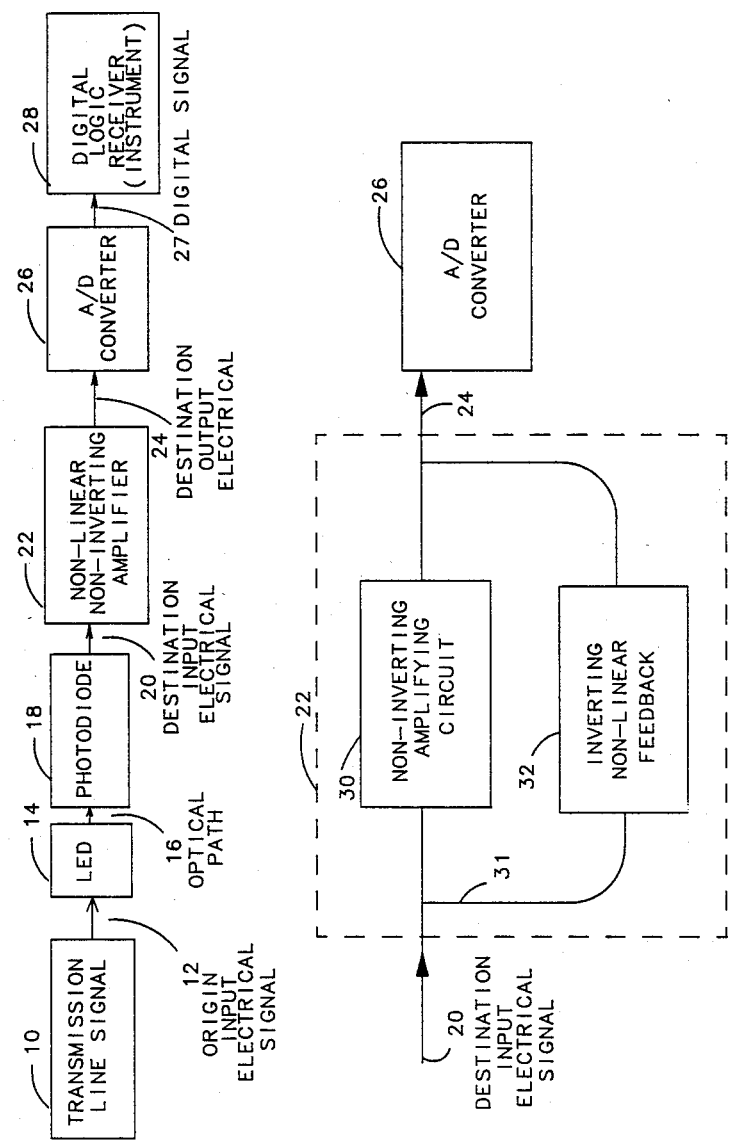

NONLINEAR NONINVERTING TRANSIMPEDANCE AMPLIFIER

BACKGROUND OF THE INVENTION

1. Field of the Invention

The present invention pertains generally to optical communications receivers for data transfer to digital functions.

2. Description of the Background

Optical transmission of information has become increasingly popular with the advent of fiber optics, light emitting diodes (LED), and photo detectors. Typical communication paths have an origin, where an electrical signal is converted to an optical signal; a transmission path, where the optical signal travels, and a destination, where the optical signal is converted back into an intelligible electrical signal. At the origin of the transmission the information must be encoded into light. This can be done by current to light converters (typified by light emitting diodes). At the destination the light must be converted back into an electrical signal. In digital transmissions what is important is to detect the presence of light. Generally, the absence of light indicates a positive logic zero, while the presence of light indicates a positive logic one. When the destination input signal reaches a predetermined threshold, the amplifier must be able to detect the presence of the signal. The threshold is chosen to be a statistically significant amount of light greater than the noise level. When a transmitting signal generates light the amount of light showing up at the destination is a function of the strength of the electrical signal which generated the light, the efficiency of the transducer, the distance the light travelled from he generating site to the destination, the various coupling efficiencies, and the amount of scattering effects during the transmission. The electrical signal that is then generated is a function of the efficiency of the photo detector (light to current converter). Consequently, the destination input electrical signal for a positive logic one can vary greatly depending on the origin of the signal, length of the transmission, and the particular generators and detectors involved. An amplifier must be able to detect a positive logic one over a wide variety of destination input electrical signal levels. Also, in digital transmissions the electrical signal noise at the receiving end must be below the signal generated by the incoming light when the incoming light level signal is small. When the incoming light signal is large, the electrical signal must be able to respond fast enough to a light signal shutting off (transition to a positive logic zero). If the high level light signal is so strong that the electrical response stays high even after the light signal drops then the bandwidth of the signal will be restricted by the time it takes for the response to drop to the positive logic zero state and this limits the frequency and therefore speed of the digital transmission, slowing it down. Amplifying optical signals poses many problems with the present technology in optical communications. Since the intensity of the signal (light) varies according to the distance travelled through optical fibers, to the efficiency of the light generator, the coupling efficiencies, and to the efficiency of the light receiver, the same origin input electrical signal can thus generate a wide variety of light signal responses which must be able to be amplified by the receiving amplifier of the system. When producing a state-of-the-art amplifier in a mass production environment every amplifier produced must be able to respond to a wide range variation of input signals since it will not always be possible to match low efficiency generators with high efficiency light to current convertors (photodiodes) and vice versa. The amplifier must be able to operate in environments where low efficiency generators and convertors are combined giving rise to small input signals and where high efficiency generators and convertors are combined giving rise to large input signals. Also, even in a given combination the raw input signal to the light generator may sufficiently vary in strength as to produce a wide range of input signals for the amplifier.

Another consideration is the demand for increased speed of communications. Inverting amplifiers with noninverting feedback are limited to an odd number of inverting amplifiers connected in series. Inverting amplifiers have an output signal opposite to the input signal. For example, given an input current i, then the output voltage, v, will be a function of i, $v=f(i)$. Often one inverting amplifier does not provide sufficient gain. While three inverting amplifiers provide enough gain for small signals, the delay time of the circuit may be too long. Two amplification stages would give the required gain, but inverting feedback would be necessary. Two inverted amplifiers connected in series would give a noninverted output signal. The output signal must, then, be inverted in the feedback in order to have negative feedback and a output commensurate with the input signal. Designing an amplifier with the requisite input dynamic range in prior technology results in adding too much delay in the system. For low signals adding an extra amplification stage results in too much delay. If delay is greater than one fourth of the period of the unity loop gain frequency the output signal will oscillate, and if the delay comes close to one fourth the period bad transient responses like ringing of the output signal occur. If the delay is decreased then the period of the unity loop gain frequency can be decreased which results in the increase of the unity loop gain frequency. As the unity loop gain frequency increases the receiver can handle a greater bandwidth. The unity loop gain frequency increases when the loop gain is increased. The loop gain is a product of the forward gain and feedback gain. In the prior art, amplification had to be an odd number of inverting amplification stages in order to produce an inverted output relative to the input so as to produce negative feedback with a noninverting feedback circuit. When an even number of inverting amplification stages would be sufficient, an extra inverting stage would be required so as to produce the necessary negative feedback. The extra stages add delay time to the system reducing stability. When the delays cause a 90 degree phase shift then the feedback becomes positive rather than negative. The loop gain must be decreased to handle more delay, thus maintaining negative feedback. This results in less bandwidth. Applicant's invention allows amplification to be in an even number of inverting stages at a time. This decreases the delay in the system. Because delay is decreased, loop gain can be increased resulting in a greater bandwidth receiver.

Present nonlinear inverting feedback has several problems: there are pattern dependent timing jitter problems, the transition from positive logic one to zero has an odd slow integrating decay, and at high input optical signal levels, it requires a wider bandwidth gain amplification circuit for stability.

Typically, either linear amplifiers or nonlinear inverting amplifiers with non-inverting feedback are used. Linear amplifiers have a limited dynamic input range because of the problem of saturation of the amplifier. A linear amplifier has an output signal linearly proportional to the input signal. For example, given an input signal i and an output signal v, then i=Gv where G is a transimpedance constant. If the linear amplifier is designed for the lowest level of input signal then the highest level input signal saturates the amplifier. The highest level input signal saturates the amplifier because of the large difference between the highest and lowest levels of input signals. Typically, the ratio can be 50:1. The problem is to maintain or increase the bandwidth of the amplifier while being able to handle the wide range of input signals from different LEDs. Linear inverting feedback would not provide the required dynamic range of the amplifier.

In order to make a linear amplifier work in this application it requires Automatic Gain Control (AGC) or limiting the bandwidth of the input signal which can be amplified. An AGC takes the output signal from the amplifier, processes it, and outputs a signal to the feedback circuit of the amplifier. Automatic Gain Control devices require switches or threshold detectors as well as amplifiers with a second feedback loop and a control element. This requires extra circuitry and thus, extra design effort and more space. There are concerns about stability, process fluctuations, reliability, manufacturing yield, and more potential for making more errors in the design, manufacture, and/or use of the amplifier. A receiver using an AGC requires substantially extra design effort of the receiver. An AGC must be designed to be stable at various control levels of voltage. An AGC includes a servo-loop and oscillating is a possibility. The second feedback loop incorporated into an AGC must be designed to be stable also. An AGC has restrictions on the type of signals it can receive, minimum data rates and minimum transitions per unit time must be specified. Although an AGC may provide a constant output signal response once the input has achieved a certain signal, the penalty of extra circuitry may not justify its use in applications where a constant response is not required or not required as rapidly as an AGC circuit may provide; the requirement is to avoid saturation of the amplifier within the expected input signal range and for the output signal to achieve a certain minimum level on a given input signal so a discriminator can recognize it as a positive logic one signal.

SUMMARY OF THE INVENTION

The present invention overcomes the limitations of the prior art by providing a nonlinear noninverting amplifier for receiving and amplifying an input signal and for producing an output signal having a gain which is a function of the amplitude of said input signal, having an amplification means with a predetermined forward noninverting gain for amplifying the input signal by the predetermined forward noninverting gain; an input terminal means coupled to the positive input of the amplification means; an output terminal means coupled to the amplification means at which a noninverted amplified output voltage appears; and a nonlinear inverting feedback means connected between the input terminal and the output terminal for producing an inverting feedback signal that varies as an inverse function of the input signal to modify the gain of the nonlinear noninverting amplifier to prevent saturation of the amplification means and provide a wide dynamic range of amplitudes of the input signals, and for producing a predetermined amplitude feedback signal whenever the input signal has a substantially zero state amplitude so as to significantly reduce the amplitude of the input signal required to cause the nonlinear inverting feedback means to turn-on.

The present invention allows the use of a noninverting amplifier or an even number of inverting amplifiers connected in series to produce amplification of the input signal over a wide dynamic range with minimum delay and eliminating extra circuitry for an automatic gain control allowing optimum integration in an integrated circuit.

The amplifier responds rapidly to a transition from positive logic one to a positive logic zero and vice versa. There are no pattern dependent timing jitter problems. There is a bias current which biases the feedback to be on all the time so the transconductance of the feedback does not go to zero when the input signal goes to zero.

In addition, at high input levels as the transconductance increases the amplifier does not require a wider bandwidth gain for stability. The gain stage of the amplication means is nonlinear. A particular way of making the gain stage nonlinear is by putting a nonlinear shunt-feedback on the second stage.

A further result is that the gain required decreases and the bandwidth of the amplifier increases. As the input signal increases, the transconductance of the feedback goes up, so feedback increases, but the gain of the amplifier goes down. This compensates for the increase in feedback which makes the loop gain more constant. When the gain is decreased the bandwidth can be increased.

The present invention allows a wide range of input signals while eliminating the need for automatic gain control devices. The feedback means operates directly from the output of the amplification means without having first being processed by an automatic gain control device. Also, the present invention allows the use of a lower gain amplifier circuit which extends the bandwidth range of the amplifier. The present invention accomplishes this by partially digitizing the input signal; once the input signal reaches a certain level the output signal increases much less than the input signal. A particular analog to digital converter circuit, called a discriminator, completes the digitizing task. The present invention eliminates the need for an automatic gain control (AGC) device. All the present invention requires is a nonlinear amplifier.

The present invention is limited by the frequency and noise limitations of the LED/photodiode input. It is anticipated that as improvements are made in LED/photodiode technology this invention could be used in high speed digital communication or over long distances. Its present use is to optically isolate a digital transmission line communication with unknown voltage levels from the digital communication input of an instrument with known voltage level requirements.

The present invention allows for total integration of the invention which can be made on one silicon chip or placed with other circuitry on the same integrated circuit. The amplifier will be stable over temperature fluctuations and process variations.

The amplification circuit gain is chosen so that the amplifier will operate in the frequency range required. In conjunction with choosing the gain, the size and relative sizes of the transistors in the feedback circuit are predetermined to operate in the proper frequency range and for operation in the appropriate dynamic range of the input signal. Choosing the transistors to be of different sizes (current carrying capability) with different source biases allows varying gain compression as a function of the output. As the output voltage increases the next size larger (width to length ratio) turns on more and decreases the input current. At least one transistor of the complementary type PMOS/NMOS or PNP/NPN) supplies current in the nonlinear inverting feedback means as the output signal goes to zero.

BRIEF DESCRIPTION OF THE DRAWINGS

FIG. 1 is a block diagram showing how the present invention can be used in a specific transmission line to an instrument receiver communication scheme.

FIG. 2 is a block diagram illustrating the relationship of the two major functional components of the nonlinear noninverting amplifier 22, the noninverting amplification circuit and the inverting nonlinear feedback, and the position of these circuits in the communication scheme.

DETAILED DESCRIPTION

Figure 4:
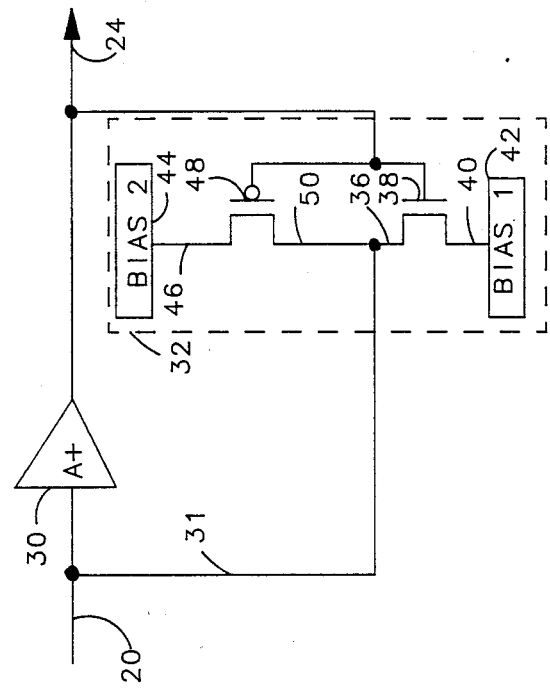
FIG. 4 illustrates another embodiment of invention using two FETs.

FIG. 1 shows one example of the manner in which the present invention 22 can be used in a communication system. In this example the optical digital path is driven by an electrical transmission line signal 10 which inputs the origin input electrical signal 12 to the LED 14. The LED 14 transmits light to the optical path 16 which transmits the light to a photodiode 18 that converts the light to a destination input electrical signal 20. The destination input electrical signal is the input signal to the nonlinear noninverting amplifier 22. The nonlinear noninverting amplifier generates an output, the destination output electrical signal 24 which is used as an input for an analog to digital converter 26. The digital signal from the A/D converter 26 is interpreted by a digital logic receiver, supplying information to the logic receiver 28. This receiver 28 can be anything which can use digital logic information, an electronic instrument, computer, video or audio display, and anything else receiving digital information. It is anticipated that an optical path line signal 16 could be used directly with this invention and replace the LED 14 at the receiving end. The LED 14 could also be at the originating end of the transmission signal, generating an optical path 16 to be received directly by the photodiode 18 at the receiving end. The destination input electrical signal 20 characteristics is a function of the transmission line signal 10 parameters, and the characteristics of the LED 14 and Photodiode 18 combination. The nonlinear noninverting amplifier is optimized with respect to the destination input electrical signal 20 characteristics so as to convert the signal into a destination output electrical signal 24 which can be converted by the A/D Converter 26 into a usable digital signal by a Digital Logic Receiver 28. The Digital Logic Receiver 28 includes, but is not limited to any instrumentation, display, computation, information processing, communication, or graphics device. The actual embodiment of the nonlinear noninverting amplifier may vary according to the transmission signal characteristics, operating environment, and particular communication system being used.

FIG. 2 shows the manner in which the nonlinear noninverting amplifier (NNA) can be designed to receive any input signal 20 from a photodiode in a digital logic transmission and to output a signal 24 which can be converted into a digital signal 27. A destination input electrical signal 20 is received by the noninverting amplifying circuit 30. The destination output electrical signal 24 is received by the inverting nonlinear feedback 32 which processes the signal and inputs a feedback signal 31 into the destination input electrical signal 20, consequently signal 24 is modified and used by the A/D converter 26.

Figure 3:
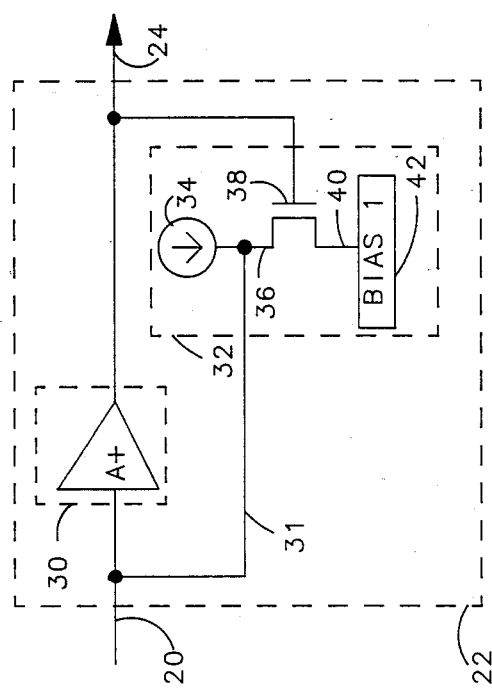
FIG. 3 illustrates one embodiment of the invention using a single FET in the feedback circuit along with a current source 34.

FIG. 3 shows a simple embodiment of the invention 22 comprising a noninverting amplification circuit 30 with a transistor 36,38,40 and current source 34 for the nonlinear inverting feedback means connected between the output 24 and input 20 of the amplification circuit. The transistor gate 38 is connected to the output signal 24, the transistor source is connected to a predetermined Bias 1 42, and the transistor drain is connected to both the current source 34 and the feedback signal 31 which is connected to the input signal 20. The transistor shown is an n-channel enhancement mode device which would be the appropriate selection for a photodiode 18 which has its cathode connected to a bias source and sources current from its anode to the noninverting amplification circuit 30. The transistor's size is determined by how much gain is required at particular input signal levels. Any type transistor can be used: field effect transistor (FET) or bipolar transistor(BJT) and in any technology: nmos, cmos, pmos, bipolar, BI-FET, discrete, or hybrid. The current source 34 could be the complementary type transistor and in this case a p-channel enhancement mode FET. The current source biases the transistor 36,38,40 so that the transconductance of the transistor does not go to zero when the input signal 20 goes to zero. If the photodiode 18 generating the input signal 20 has its anode connected to a bias source and sources current from its cathode, then one embodiment is to choose the transistor to be a p-channel enhancement mode FET with the substrate underneath the gate 38 connected to the source 40.

FIG. 4 shows the connection between the two transistors and is a general schematic for a simple embodiment using a complementary FET as a current source. An example of a current source 32 is the combination of transistor 46,48,50 and Bias 2 44. Choose Bias 2 44 so that the transistor 46,48,50 conducts current when the output signal 24 is in the zero state level. This current through both transistor drains 50,36 establishes a voltage signal at the feedback signal 31 to input signal 20.

The voltage signal biases the amplification circuit to be ready for a low level nonzero state input signal 20. If the photodiode 18 generating the input signal 20 has its cathode connected to a bias source and its anode sources current then Bias 1 of the n-channel enhancement mode FET is ground and the other transistor is a p-channel enhancement mode FET. If the photodiode generating the input signal 20 has its anode connected to a bias source and its cathode sources current then Bias 2 of the p-channel enhancement mode FET is ground and the other transistor is an n-channel enhancement mode FET.

Figure 5:
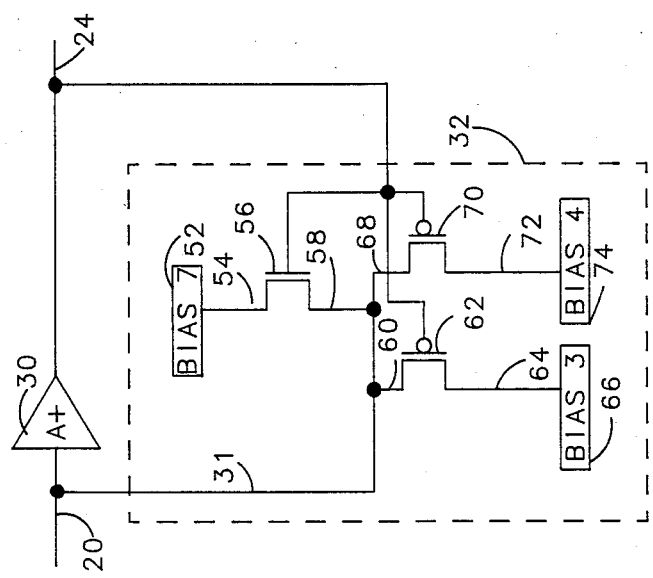
FIG. 5 illustrates another embodiment of the invention.

FIG. 5 shows an embodiment in which further gain compression can be achieved. A third FET 68,70,72 and Bias 4 74, consistent with the type required by the input signal 20, is connected to both of the other transistors, drains to drains 68,58,60, gates to gates 70,62,56, and a different bias 74 to the source 72 so the transistor 68,70,72 starts to conduct current at larger output signals than when the first FET 60,62,64 starts to conduct current. Bias 4 74 is chosen so that the third FET 68,70,72 turns on after the first FET 60,62,64 to prevent saturation of the amplification circuit 30 when the input signal 20 is too large for the first FET 60,62,64 to prevent saturation of the amplification circuit. The third FET 68,70,72 has a larger gate width to gate length ratio (beta) in order to carry the larger amount of current generated by the larger input signal 20. The second FET 54,56,58 and Ground 52 provide the current source at zero state input signal 20.

Figure 6:
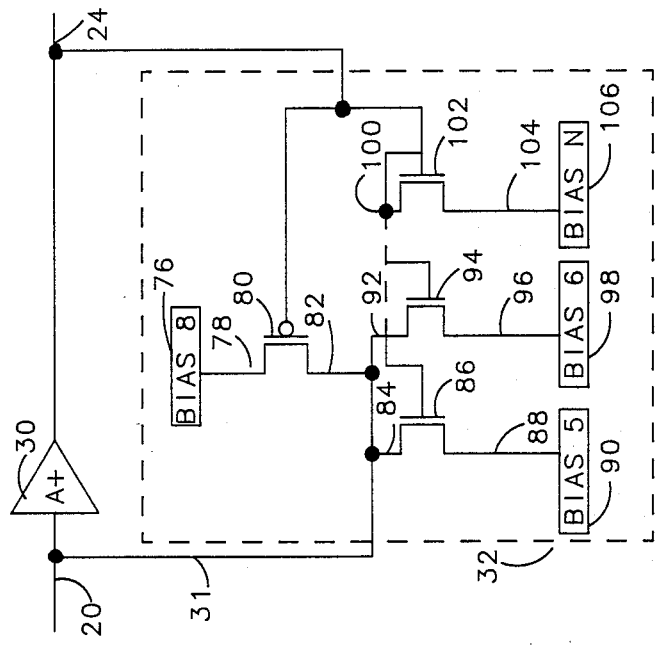
FIG. 6 illustrates another embodiment showing a generalized solution for providing increasing gain compression that can be used in a wide range of applications.

FIG. 6 shows how more FETs can be added to prevent saturation of the amplification circuit 30 at large input signals 20. Each subsequent FET 100,102,104 is chosen to handle larger currents than the preceding FET 92,94,96, larger beta, and to turn on at a larger output signal 24. For each subsequent transistor, the drain 100 is connected to the other drains 92,84,82, the gate 102 is connected to the other gates 94,86,80 and the source is connected to a bias 106 so as to provide the appropriate current conduction to prevent saturation of the amplification circuit 30 at larger input signals 20. The transistor types are chosen appropriate to whether the photodiode generating the input signal 20 has its anode or cathode sourcing current. FIG. 6 shows a general embodiment for an input signal 20 generated by a photodiode which has its anode connected to a bias source and its cathode sources current. The p-channel FET 78,80,82 and Ground 76 provide the current source for zero state input signals 20.

The invention can be designed by knowing the dynamic range of the input signal 24 $i_{min}$- $i_{max}$, the required minimum out voltage 31 $v_{min}$, the saturation current level of the amplification circuit $i_{sat}$, and the required frequency bandwidth of operation.

Figure 7:
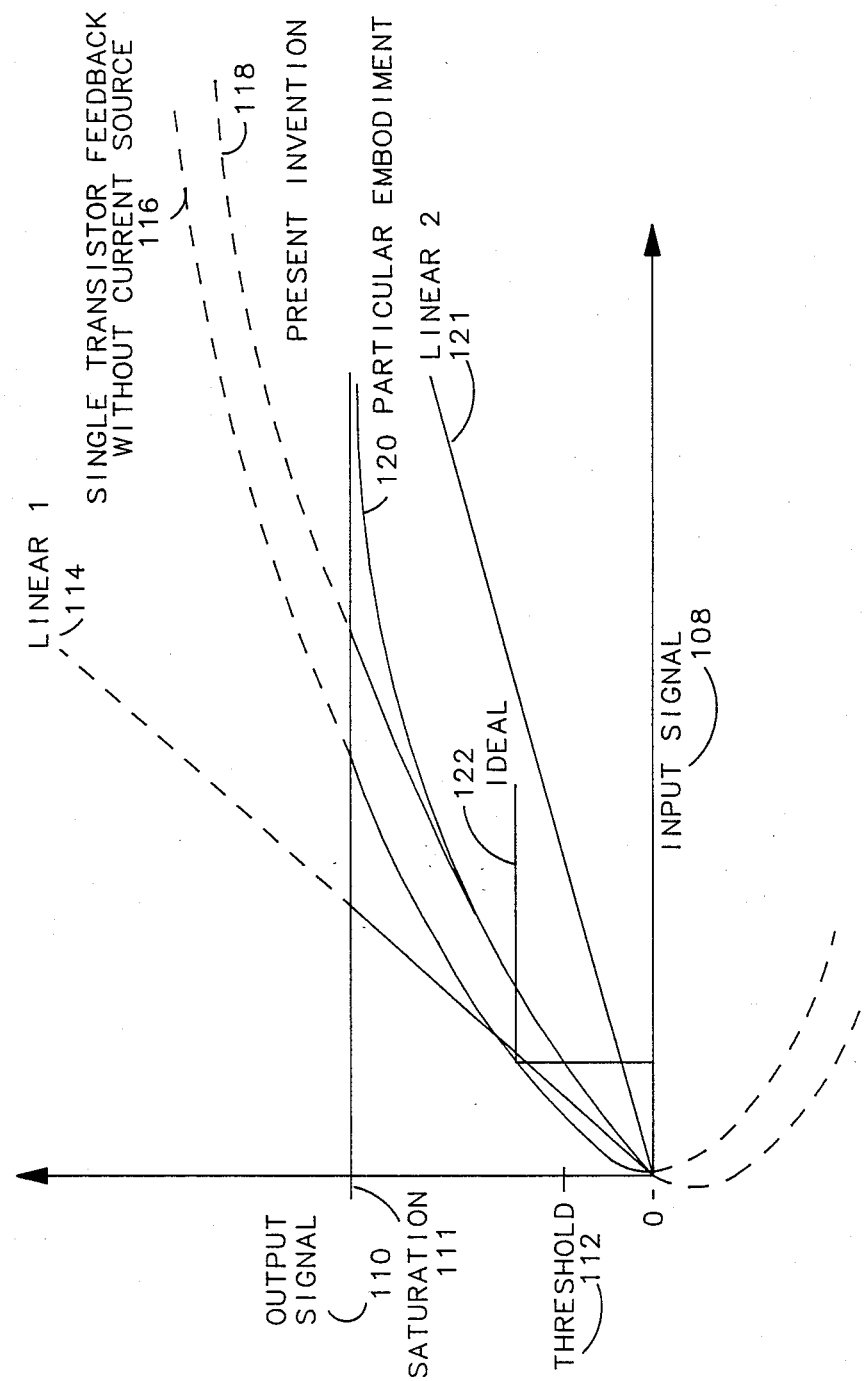
FIG. 7 is a graph illustrating output signal for various amplifier circuits.

FIG. 7 describes the output signal 110 as a function of the input signal 108 for various amplifier designs. The saturation level 111 is shown. When the output signal reaches saturation the amplifier stores charge and there is increased delay time for the amplifier to respond to a decrease in the input signal resulting in a decrease in the amplifier bandwidth. The threshold 112 is shown. The threshold is a predetermined output signal value designed to indicate that an input signal is being received by the amplifier. The Ideal 122 curve is shown. The ideal amplifier would instantly produce an output signal above the threshold for a predetermined input signal and yet never reach saturation 111. Linear 1 114 amplifies small signals so the input signal can be detected by the convertor, but large signals saturate the amplifier thus restricting the dynamic range of the amplifier or reducing the bandwidth of the amplifier allowing the amplifier time in responding to a zero state input after a large signal one state input which saturated the amplifier. Linear 2 121 prevents saturation of the amplifier at large signals but, small signals may not reach positive logic one levels and be recognized as a logic signal. The one transistor feedback 116 is better because it reaches threshold output signal for lower input signals than Linear 2 121 and yet, reaches saturation for larger input signals than Linear 1 114, but is still not sufficient for both large and small signals over most dynamic range applications of the input. The present invention 118 while not reaching threshold for as low an input signal as single transistor feedback without current source 116 does not reach saturation as quickly as single transistor feedback without current source 116 and this results in a net increase bandwidth amplifier. The present invention 118 is an example of a curve obtained from the designs of FIG. 3 and FIG. 4. The particular embodiment 120 while reaching threshold at about the same input signal as present invention 118 does not reach saturation until much later than either single transistor feedback without current source 116 or present invention 118. The particular embodiment 120 is an example of a curve obtained from designs shown in FIG. 8 and FIG. 9.

Figure 8:
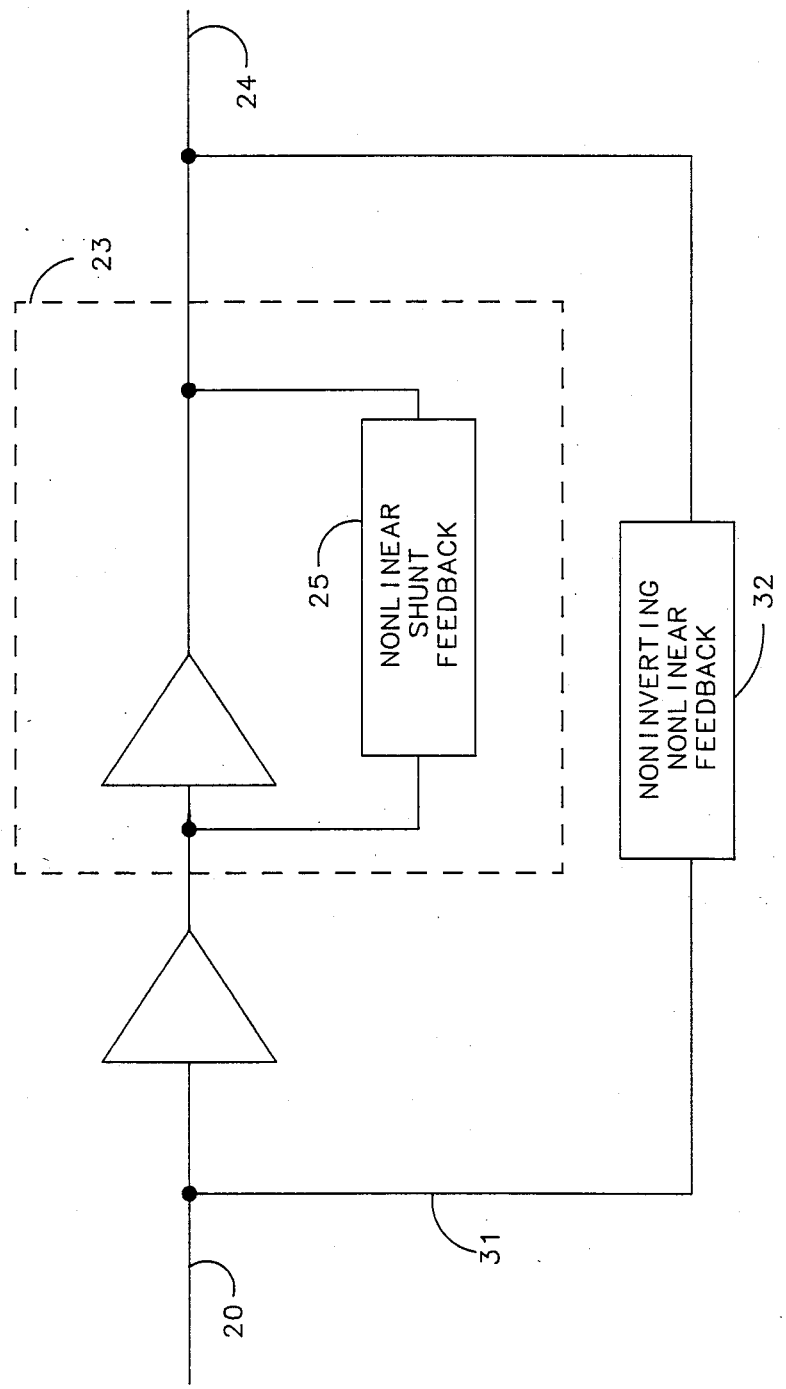
FIG. 8 illustrates an embodiment of the invention using a nonlinear gain stage 23.

FIG. 8 shows a particular embodiment of the noninverting amplification circuit 30 using two inverting amplifiers 27 and 29. The noninverting amplification circuit contains a nonlinear gain stage 23. One way to achieve a nonlinear gain stage 23 is to use a nonlinear shunt feedback 25 across one inverting amplifier 29.

Figure 9:
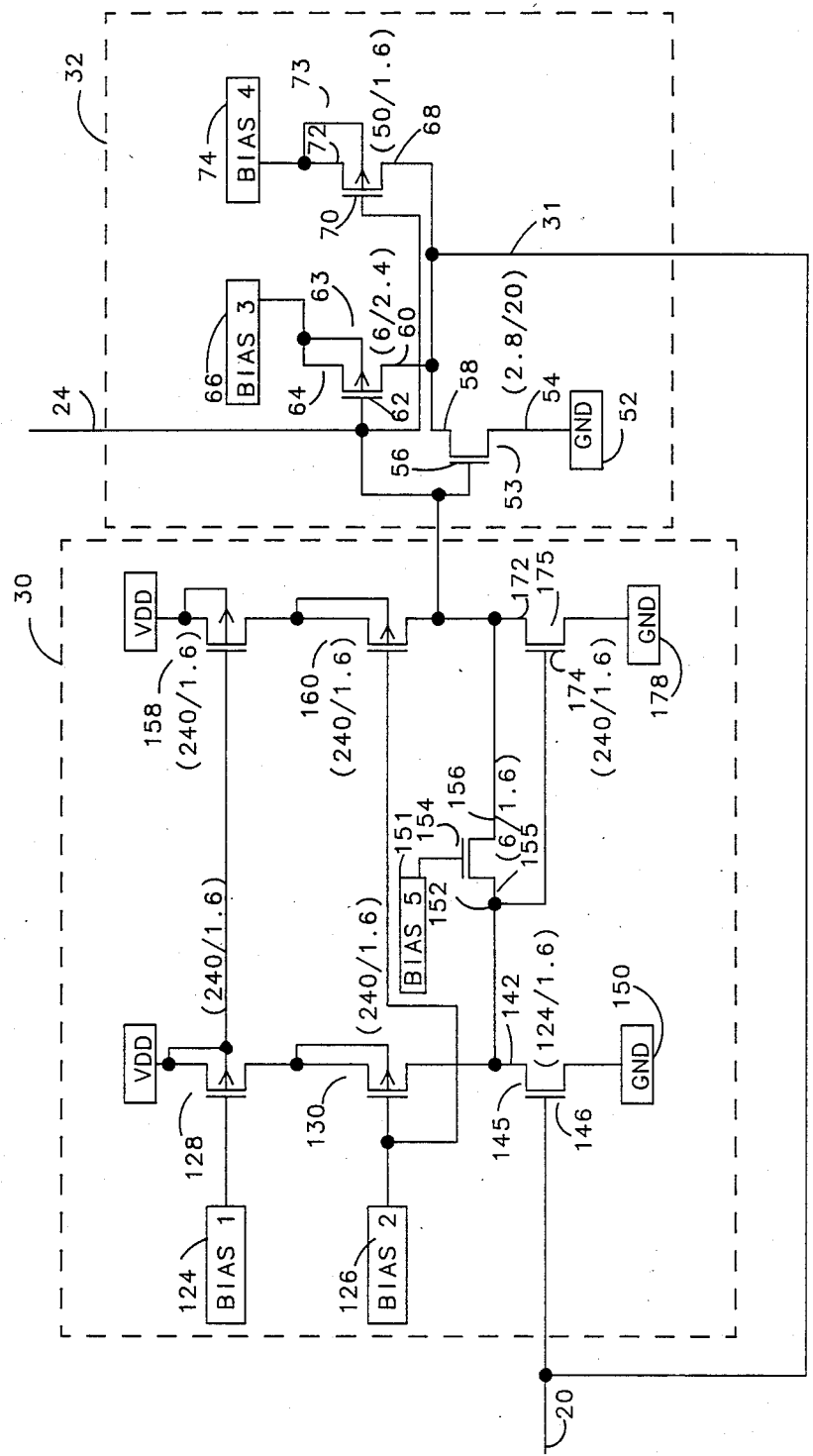
FIG. 9 is a detailed schematic diagram of the device illustrated in FIG. 5 with the nonlinear gain stage of FIG. 8.

FIG. 9 shows a particular implementation of the schematically illustrated device of FIG. 5 and FIG. 8. The amplification circuit 30 is composed of components 124 through 178. The input signal 20 is connected to the feedback signal 31. The combination of the two is connected to the gate 146 of the first inverting amplifier 145. The output of the first transistor 142 is connected to the gate 174 of the second inverting amplifier 175. A nonlinear noninverting feedback 155 is provided for the second amplifier transistor 175 by connecting the drain 152 of the feedback transistor 155 to the gate 174 of the second amplifier transistor 175 and by connecting the source 156 of the feedback transistor 155 to the drain 172 of the second amplifier transistor 175. Bias 151 is connected to the gate 154 of the feedback transistor. FETs 128 and 130 function as a current source and provide the proper bias operating range for the first amplifier transistor 145. FETs 158 and 160 function as a current source provide the proper bias operating range for the second amplifier transistor 175. The output signal 24 of the amplification circuit 30 is taken off of the drain 172 of the second amplifier transistor 175. The output signal 24 is connected to the gates 56,62,70 of all the feedback transistors 53,63,73 respectively. The transistors 53,63,73 are all connected as described in FIG. 5. The feedback signal 31 connects the drains 58,60,68 to the input signal 20. The width to length ratios given in two numbers beside each transistor indicate the relative beta values of the transistors. FIG. 8 was designed with the following values: Dynamic range=2-50 microamps; output voltage range=1.44-0.9 volts; Bandwidth=20 MHz; Bias 124=1.97 v; Bias 126=1.60 v; Bias 151=2.46 v; Bias 66=1.98 v; Bias 74=2.72 v; VDD=5 v.

Figure 10:
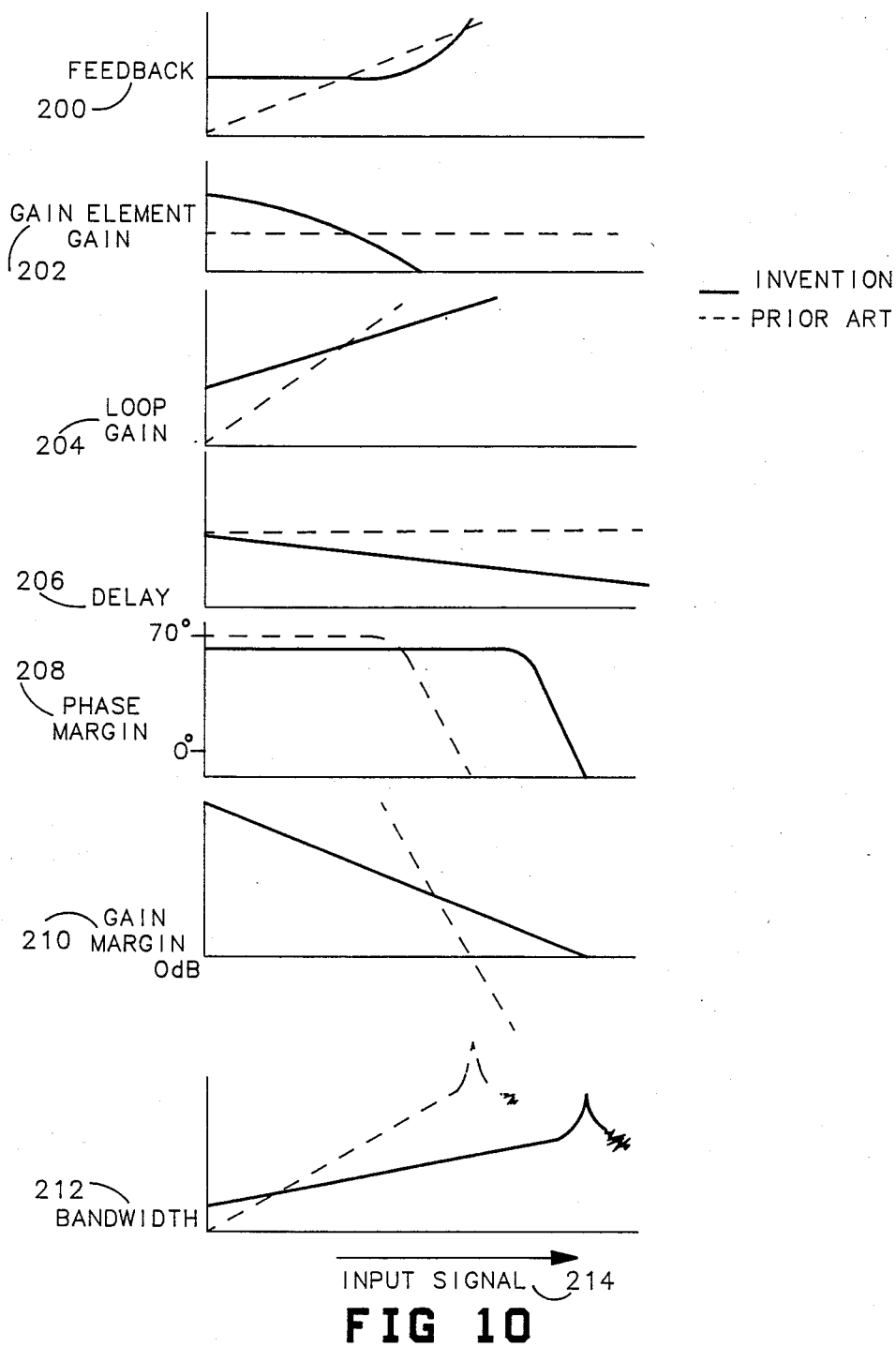
FIG. 10 is a graphical comparison of the present invention over a typical amplifier.

FIG. 10 illustrates the advantages of the present invention. The Feedback 200 contrasts the present invention's nonlinear feedback with the prior art linear feedback. The loop gain 204 of the invention stays more constant as the input signal 214 increases than the prior art because decreasing the gain of the amplifier compensates for the increase of the input signal 214. As the loop gain 204 of the invention stays more constant than the prior art the delay 206 of the invention decreases with higher input signal. As the bandwidth 212 increases with higher input, the output would start to oscillate and would eventually become useless so the amplifier must be designed so it won't oscillate by having the gain go to less than unity. The gain can be made to go to less than unity by keeping the initial gain 202 fairly low and keeping the bandwidth 212 low and, then, the saturation of the amplifier eliminates the gain at high input signal levels. One particular embodiment of the invention controls the gain 202 by a nonlinear shunt feedback in the second amplification stage. The input signal where the gain margin 210 becomes 0 dB is where the phase margin 208 goes to zero and oscillation occurs. Since the invention has a shallower gain margin 210 the phase margin 208 is extended and the point of oscillation on the Bandwidth 212 occurs at a higher input signal 214 than the prior art.

The described embodiments use FETs, but there are corresponding designs using bipolar junction transistors. It is anticipated the invention 22 can be designed into any transistor technology using conventional circuit analysis techniques given the specific characteristics of the input signal 20, desired constraints of the output signal 24, and frequency response required. Equivalent designs in series-series, shunt-series, and series-shunt as well as shunt-shunt amplifiers can be made.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A nonlinear noninverting amplifier for receiving and amplifying an input signal and for producing an output signal having a gain which is a function of the amplitude of said input signal comprising:
    amplification means having a predetermined forward noninverting gain for amplifying said input signal by said predetermined forward noninverting gain;
    input terminal means for coupling to a positive input of said amplification means;
    output terminal means for coupling to said amplification means at which a noninverted amplified output voltage appears,
    nonlinear inverting feedback means, connected between said input terminal means and said output terminal means, for producing an inverting feedback signal that varies as an inverted function of said input signal to modify said gain of said nonlinear noninverting amplifier to prevent saturation of said amplification means and provide a wide dynamic range of amplitudes of said input signals and,
    biasing means for producing a predetermined amplitude feedback signal whenever said input signal has a substantially zero state amplitude so as to significantly reduce the amplitude of said input signal required to cause said nonlinear inverting feedback means to turn-on.

2. The receiver of claim 1 wherein said nonlinear inverting feedback means comprises a plurality of transistors each having a gate, a source, and a drain wherein all said gates are connected together and connected to said output of said amplification means; all said drains are connected together and connected to said input of said amplification means; and said source of each of said transistors connected to one of a plurality of biases and further comprising a current source connected to said input of said amplification means to provide a bias current source for said transistors when said input signal goes to a zero state amplitude.

3. The amplifier of claim 2 wherein said current source is a transistor chosen to be of the complementary type to said plurality of transistors, having a drain connected to the input of said amplification means, a gate connected to said gates of said plurality of transistors, a source connected to a bias.

4. The amplifier of claim 1 wherein said nonlinear inverting feedback means comprises:
    a first transistor FET1 having a source connected to a first bias, a drain, and a gate;
    a second transistor FET2 having a source connected to a second bias, a drain, and a gate;
    a complementary transistor FET3 having a source connected to a third bias, a drain, and a gate;
    said input terminal of said voltage amplification circuit connected to said drain of FET1 and connected to said drain of FET2 and connected to said drain of FET3;
    said output terminal of said voltage amplification circuit connected to said gates of FET1, FET2, and FET3.

5. The amplifier of claim 4 wherein said first bias has a different voltage of said second bias and wherein, said second transistor having a current carrying capability greater than said first transistor.

6. The amplifier of claim 1 where the nonlinear inverting feedback means comprises a transistor preselected to complement type of photodiode current, having a drain, a gate, and a source, wherein said drain is connected to a current source and said drain is connected to said input terminal means of said amplification circuit, said gate connected to output terminal means of said amplification circuit, said source connected to a predetermined bias.

7. The amplifier of claim 6 wherein the current source is a second transistor, preselected to complement said transistor, having a drain, a gate, a source, wherein said second transistor gate is connected to the output terminal means of said amplification circuit, said second transistor drain connected to said transistor drain, and said second transistor source connected to a second predetermined bias.

8. The amplifier of claim 1 wherein said amplification means comprises a first inverting amplifier having an input and an output and a second inverting amplifier having an input and an output, said output of said first inverting amplifier connected to said input of said second inverting amplifier, said input of said first inverting amplifier being said input terminal means and said output of said second inverting amplifier being said output terminal means.

9. The amplifier of claim 8 wherein said nonlinear inverting feedback means comprises a plurality of transistors each having a gate, a source, and a drain wherein all said gates are connected together and connected to said output of said amplification means; all said drains are connected together and connected to said input of said amplification means; and said source of each of said transistors connected to one of a plurality of biases and further comprising a current source connected to said input of said amplification means to provide a bias current source for said transistors when said input signal goes to a zero state amplitude.

10. The amplifier of claim 9 wherein said current source is a transistor chosen to be of the complementary type to said plurality of transistors, having a drain connected to the input of said amplification means, a gate connected to said gates of said plurality of transistors, a source connected to ground.

11. The amplifier of claim 8 wherein said nonlinear inverting feedback means comprises:
a first transistor FET1 having a source connected to a first bias, a drain, and a gate;
a second transistor FET2 having a source connected to a second bias, a drain, and a gate;
a complementary transistor FET3 having a source connected to a third bias, a drain, and a gate;
said input terminal of said voltage amplification circuit connected to said drain of FET1 and connected to said drain of FET2 and connected to said drain of FET3;
said output terminal of said voltage amplification circuit connected to said gates of FET1, FET2, and FET3.

12. The amplifier of claim 11 wherein said first bias has a different voltage of said second bias and wherein, said second transistor having a current carrying capability greater than said first transistor.

13. The amplifier of claim 8 where the nonlinear inverting feedback means comprises a transistor preselected to complement type of photodiode current, having a drain, a gate, and a source, wherein said drain is connected to a current source and said drain is connected to said input terminal means of said amplification circuit, said gate connected to output terminal means of said amplification circuit, said source connected to a predetermined bias.

14. The amplifier of claim 13 wherein the current source is a second transistor, preselected to complement said transistor, having a drain, a gate, a source, wherein said second transistor gate is connected to the output terminal means of said amplification circuit, said second transistor drain connected to said transistor drain, and said second transistor source connected to a second predetermined bias.

15. The amplifier of claim 8 wherein said second inverting amplifier has a negative feedback means for providing output voltage stability connected between said output and said input of second inverting amplifier.

16. The amplifier of claim 15 wherein said nonlinear inverting feedback means comprises a plurality of transistors each having a gate, a source, and a drain wherein all said gates are connected together and connected to said output of said amplification means; all said drains are connected together and connected to said input of said amplification means; and said source of each of said transistors connected to one o a plurality of biases and further comprising a current source connected to said input of said amplification means to provide a bias current source for said transistors when said input signal goes to a zero state amplitude.

17. The amplifier of claim 16 wherein said current source is a transistor chosen to be of the complementary type to said plurality of transistors, having a drain connected to the input of said amplification means, a gate connected to said gates of said plurality of transistors, a source connected to a bias.

18. The amplifier of claim 15 wherein said nonlinear inverting feedback means comprises:
a first transistor FET1 having a source connected to a first bias, a drain, and a gate;
a second transistor FET2 having a source connected to a second bias, a drain, and a gate;
a complementary transistor FET3 having a source connected to a third bias, a drain, and a gate;
said input terminal of said voltage amplification circuit connected to said drain of FET1 and connected to said drain of FET2 and connected to said drain of FET3;
said output terminal of said voltage amplification circuit connected to said gates of FET1, FET2, and FET3.

19. The amplifier of claim 18 wherein said first bias has a different voltage of said second bias and wherein, said second transistor having a current carrying capability greater than said first transistor.

20. The amplifier of claim 15 where the nonlinear inverting feedback means comprises a transistor preselected to complement type of photodiode current, having a drain, a gate, and a source, wherein said drain is connected to a current source and said drain is connected to said input terminal means of said amplification circuit, said gate connected to output terminal means of said amplification circuit, said source connected to a predetermined bias.

21. The amplifier of claim 20 wherein the current source is a second transistor, preselected to complement said transistor, having a drain, a gate, a source, wherein said second transistor gate is connected to the output terminal means of said amplification circuit, said second transistor drain connected to said transistor drain, and said second transistor source connected to a second predetermined bias.

22. The amplifier of claim 1 wherein said amplification means comprises a nonlinear gain stage so that a output signal from said gain stage is not linearly proportional to an input signal into said gain stage.

23. The receiver of claim 22 wherein said nonlinear inverting feedback means comprises a plurality of transistors each having a gate, a source, and a drain wherein all said gates are connected together and connected to said output of said amplification means; all said drains are connected together and connected to said input of said amplification means; and said source of each of said transistors connected to one of a plurality of biases and further comprising a current source connected to said input of said amplification means to provide a bias current source for said transistors when said input signal goes to a zero state amplitude.

24. The amplifier of claim 23 wherein said current source is a transistor chosen to be of the complementary type to said plurality of transistors, having a drain connected to the input of said amplification means, a gate connected to said gates of said plurality of transistors, a source connected to a bias.

25. The amplifier of claim 22 wherein said nonlinear inverting feedback means comprises:
   a first transistor FET1 having a source connected to a first bias, a drain, and a gate;
   a second transistor FET2 having a source connected to a second bias, a drain, and a gate;
   a complementary transistor FET3 having a source connected to a third bias, a drain, and a gate;
   said input terminal of said voltage amplification circuit connected to said drain of FET1 and connected to said drain of FET2 and connected to said drain of FET3;
   said output terminal of said voltage amplification circuit connected to said gates of FET1, FET2, and FET3.

26. The amplifier of claim 25 wherein said first bias has a different voltage of said second bias and wherein, said second transistor having a current carrying capability greater than said first transistor.

27. The amplifier of claim 22 where the nonlinear inverting feedback means comprises a transistor preselected to complement type of photodiode current, having a drain, a ate, and a source, wherein said drain is connected to a current source and said drain is connected to said input terminal means of said amplification circuit, said gate connected to output terminal means of said amplification circuit, said source connected to a predetermined bias.

28. The amplifier of claim 27 wherein the current source is a second transistor, preselected to complement said transistor, having a drain, a gate, a source, wherein said second transistor gate is connected to the output terminal means of said amplification circuit, said second transistor drain connected to said transistor drain, and said second transistor source connected to a second predetermined bias.

29. The amplifier of claim 22 wherein said nonlinear gain stage comprises an inverting amplifier with a nonlinear noninverting feedback.

30. The receiver of claim 29 wherein said nonlinear inverting feedback means comprises a plurality of transistors each having a gate, a source, and a drain wherein all said gates are connected together and connected to said output of said amplification means; all said drains are connected together and connected to said input of said amplification means; and said source of each of said transistors connected to one of a plurality of biases and further comprising a current source connected to said input of said amplification means to provide a bias current source for said transistors when said input signal goes to a zero state amplitude.

31. The amplifier of claim 30 wherein said current source is a transistor chosen to be of the complementary type to said plurality of transistors, having a drain connected to the input of said amplification means, a gate connected to said gates of said plurality of transistors, a source connected to a bias.

32. The amplifier of claim 29 wherein said nonlinear inverting feedback means comprises:
   a first transistor FET1 having a source connected to a first bias, a drain, and a gate;
   a second transistor FET2 having a source connected to a second bias, a drain, and a gate;
   a complementary transistor FET3 having a source connected to a third bias, a drain, and a gate;
   said input terminal of said voltage amplification circuit connected to said drain of FET1 and connected to said drain of FET2 and connected to said drain of FET3;
   said output terminal of said voltage amplification circuit connected to said gates of FET1, FET2, and FET3.

33. The amplifier of claim 32 wherein said first bias has a different voltage of said second bias and wherein, said second transistor having a current carrying capability greater than said first transistor.

34. The amplifier of claim 29 where the nonlinear inverting feedback means comprises a transistor preselected to complement type of photodiode current, having a drain, a gate, and a source, wherein said drain is connected to a current source and said drain is connected to said input terminal means of said amplification circuit, said gate connected to output terminal means of said amplification circuit, said source connected to a predetermined bias.

35. The amplifier of claim 34 wherein the current source is a second transistor, preselected to complement said transistor, having a drain, a gate, a source, wherein said second transistor gate is connected to the output terminal means of said amplification circuit, said second transistor drain connected to said transistor drain, and said second transistor source connected to a second predetermined bias.

* * * * *